United States Patent
Blaettler et al.

(10) Patent No.: US 10,348,334 B2
(45) Date of Patent: Jul. 9, 2019

(54) REDUCING A DECODING ERROR FLOOR BY POST-PROCESSING CODEWORDS ENCODED BY BINARY SYMMETRY-INVARIANT PRODUCT CODES

(71) Applicant: INTERNATIONAL BUSINESS MACHINES CORPORATION, Armonk, NY (US)

(72) Inventors: Tobias Blaettler, Maur (CH); Thomas Mittelholzer, Zurich (CH); Nikolaos Papandreou, Zurich (CH); Thomas Parnell, Zurich (CH); Charalampos Pozidis, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 431 days.

(21) Appl. No.: 15/333,612

(22) Filed: Oct. 25, 2016

(65) Prior Publication Data

US 2018/0115325 A1 Apr. 26, 2018

(51) Int. Cl.
*H03M 13/29* (2006.01)
*H03M 13/15* (2006.01)

(52) U.S. Cl.
CPC ... *H03M 13/2951* (2013.01); *H03M 13/2909* (2013.01); *H03M 13/2948* (2013.01); *H03M 13/152* (2013.01)

(58) Field of Classification Search
CPC ........................ H03M 13/2951; H03M 13/2948
See application file for complete search history.

(56) References Cited

U.S. PATENT DOCUMENTS

| | | | |
|---|---|---|---|
| 8,006,172 B2 | 8/2011 | Boyer et al. | |
| 8,312,354 B1 | 11/2012 | Varnica et al. | |
| 8,868,999 B1 * | 10/2014 | Varnica | H03M 13/373 714/752 |
| 8,880,987 B2 | 11/2014 | Sharon et al. | |
| 8,984,376 B1 * | 3/2015 | Norrie | H03M 13/1142 714/772 |
| 9,148,252 B2 | 9/2015 | Wang | |
| 9,166,627 B2 | 10/2015 | Cideciyan et al. | |
| 10,177,787 B1 * | 1/2019 | Danjean | H03M 13/1142 |
| 2006/0248435 A1 * | 11/2006 | Haratsch | H03M 13/455 714/784 |

(Continued)

*Primary Examiner* — Joseph D Torres

(74) *Attorney, Agent, or Firm* — Brian F. Russell; Robert Sullivan

(57) ABSTRACT

A decoder performs iterative decoding of a codeword encoded by a binary symmetry-invariant product code, such as a half product code or quarter product code. In response to the iterative decoding reaching a stopping set, the decoder determines by reference to an ambient error graph formed from the stopping set whether or not the stopping set is correctable by post-processing. If not, the decoder outputs the uncorrected codeword and signals a decoding failure. In response to determining that the stopping set is correctable by post-processing, the decoder inverts all bits of the codeword corresponding to edges of the ambient error graph, applies an additional round of iterative decoding to the codeword to obtain a corrected codeword, and outputs the corrected codeword. Post-processing in this manner substantially lowers an error floor associated with the binary symmetry-invariant product code.

20 Claims, 10 Drawing Sheets

(56) References Cited

U.S. PATENT DOCUMENTS

| | | | |
|---|---|---|---|
| 2010/0088575 A1* | 4/2010 | Sharon | G06F 11/1072 714/763 |
| 2010/0218066 A1* | 8/2010 | Okamura | H03M 13/1105 714/752 |
| 2011/0246849 A1* | 10/2011 | Rault | H03M 13/1128 714/752 |
| 2013/0080862 A1* | 3/2013 | Bennett | G06F 11/1076 714/782 |
| 2015/0046767 A1* | 2/2015 | Cideciyan | H03M 13/2909 714/755 |
| 2015/0160991 A1 | 6/2015 | Stojanovic et al. | |
| 2015/0309869 A1 | 10/2015 | Mittelholzer et al. | |

* cited by examiner

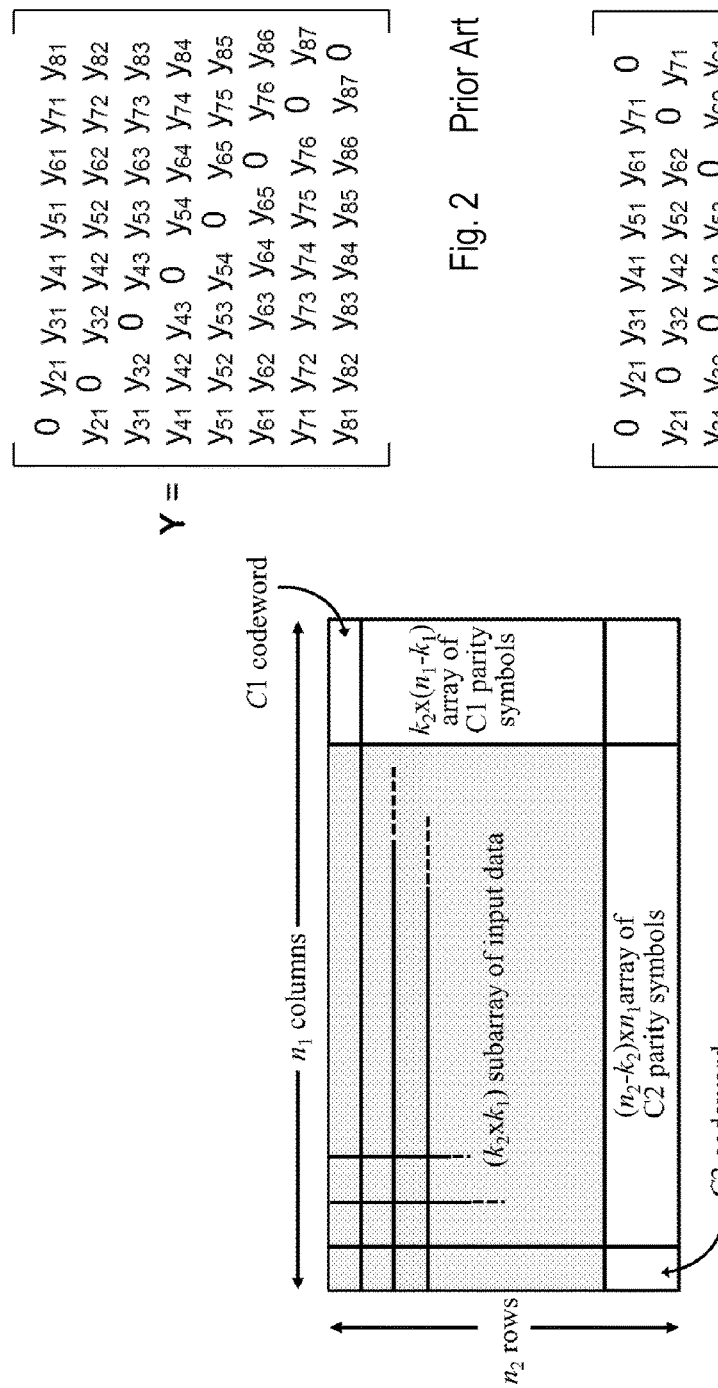

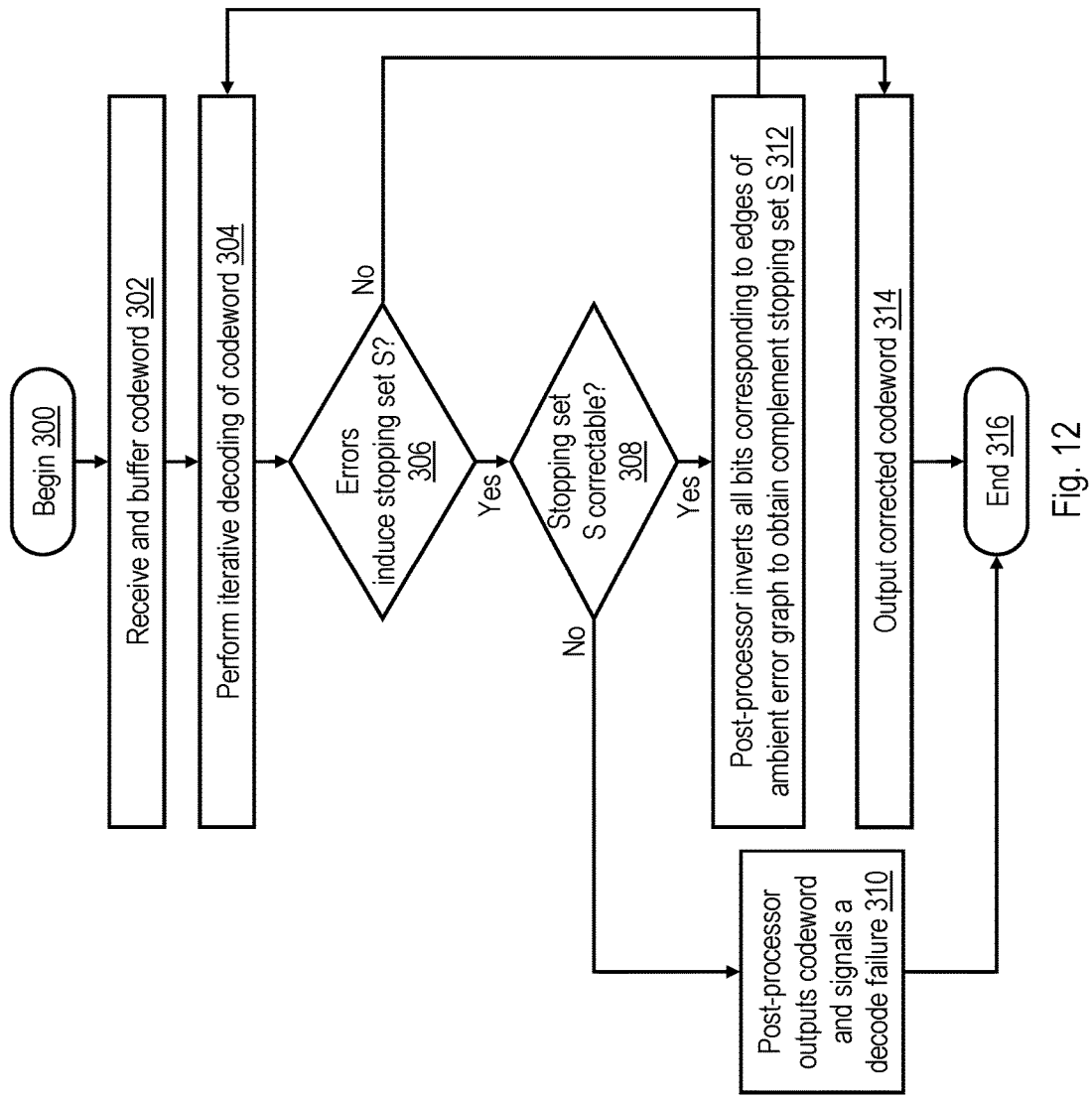

REDUCING A DECODING ERROR FLOOR BY POST-PROCESSING CODEWORDS ENCODED BY BINARY SYMMETRY-INVARIANT PRODUCT CODES

BACKGROUND OF THE INVENTION

This disclosure relates to data processing, and more specifically, to decoding data encoded utilizing binary symmetry-invariant product codes (e.g., half or quarter product codes), for example, in data storage systems or data communication systems.

Error-correction encoding is employed in data storage systems and data communication systems to improve the accuracy with which data can be recovered from a data channel. By encoding data in accordance with an error-correction code (ECC) before supplying the data to the channel, errors at the channel output can be identified and corrected to an extent dependent on the properties of the ECC. Numerous such ECC schemes are known. One well-known class of ECC scheme is based on product codes. A product code uses two component ECC codes to encode rows and columns of a notional two-dimensional array of input data.

The basic structure of a conventional product code is illustrated schematically in FIG. 1. The input data symbols (which in general may be $q^{ary}$ symbols, having q possible symbol values, where q≥2) are assigned to respective symbol locations in a notional array having $n_2$ rows and $n_1$ columns of symbol locations. In this example, $k_2 \times k_1$ data symbols are assigned to respective locations in a $k_2$ by $k_1$ subarray at the intersection of the first $k_2$ rows and first $k_1$ columns of the $n_2$ by $n_1$ array. The resulting array of input data symbols is encoded by separately encoding the rows and columns of the array. A first ECC code C1 is used to encode the $k_1$-symbol data word in each row of the array into a length-$n_1$ C1 codeword. This example uses systematic encoding, whereby the input data is retained in the codeword. In particular, the $n_1$ code symbols of a C1 codeword are obtained by adding ($n_1 - k_1$) parity symbols after the $k_1$-symbol data word in a given row. A second ECC code C2 is then used to encode the $k_2$-symbols in each column of the array into a length-$n_2$ C2 codeword, here by adding ($n_2 - k_2$) parity symbols at the end of each column. The resulting $n_2 \times n_1$ code symbols in the array form the output codeword of the product code. In an extension of this basic idea, an interleaved product code applies the C2 code over s>1 evenly spaced columns of the array, resulting in $n_1/s$ C2 codewords.

Product codes can offer practical encoder/decoder implementations, their decoders being hard-decision based and thus avoiding the various complexity and latency issues associated with soft-decision decoding. Some decoders for interleaved product codes use the technique of iterative decoding based on a graph defined from the basic code structure. Briefly, a bipartite graph can be defined with $n_2$ right nodes, each corresponding to a C1 codeword, and $n_1/s$ left nodes corresponding to respective C2 codewords. Each right node is connected to each left node by s edges. The s edges connecting a pair of nodes represent the s common symbols at the intersections of the C1 and C2 codewords for those nodes in the notional array described above. Iterative decoding is performed based on the graph by decoding the C1 codewords one-by-one, then decoding the C2 codewords one-by-one. Each time a codeword is successfully decoded, the edges leaving the appropriate node are corrected. The process iterates until decoding is complete, that is, either no more errors are detected by the decoder or a predetermined maximum number of iterations has been reached, in which case, the decoder may declare a decoding failure.

Another ECC scheme based on product codes is proposed in the context of optical transmission networks (OTNs) in J. Justesen, "Error correcting coding for OTN," IEEE Communications Magazine, September 2010, and J. Justesen, Performance of Product Codes and Related Structures with Iterative Decoding, IEEE Transactions on Communications, 2011. These codes, referred to as half product codes (HPCs), are product codes which use identical codes for the row code C1 and the column code C2. If each component code C1 and C2 is a rate k/n code with a code length (i.e., number of symbols in a codeword) of n, and a dimension (i.e., number of data symbols encoded into each codeword) of k, then the resulting product code C has length $N=n^2$, dimension $K=k^2$, and rate $(k/n)^2$. A codeword of C can be defined by an (n by n)-symbol matrix X corresponding to the notional array described above, where each row and column of X is a codeword of the row/column code. The corresponding half product code $C_H$ is then defined by $C_H = \{X - X^T : X \in C\}$, where $X^T$ is the transpose matrix of X.

Note that if X is a codeword then so is $X^T$ because the row and column codes are the same. By construction, every codeword $Y_H$ of $C_H$ has a zero diagonal (where the diagonal is defined here as the line of symbols extending diagonally across the (n by n)-symbol matrix $Y_H$ from the top left symbol to the bottom right symbol). That is, all symbols on the diagonal are of value zero. Since it follows from the definition of $C_H$ that $Y_H = Y_H^T$, the set of n(n−1)/2 symbols in the triangular subarray on each side of the diagonal is the same. These n(n−1)/2 symbols thus define the codeword $Y_H$ whereby the half product code has an effective length of $N_H = n(n-1)/2$. With HPCs, encoding and iterative decoding is performed in the same manner as for product codes, but the input data is restricted to the triangular subarray on one side of the diagonal, giving a dimension of $K_H = k(k-1)/2$ for the HPC. An exemplary HPC is illustrated in FIG. 2.

As a further extension of product code symmetry, consider further a $q^{ary}$ product code C with identical row and column codes $C_S$ with parameters n=2n', k, t (where t is the correcting capability or number of errors that can be corrected in a codeword) and rate k/n. Assuming that the component code $C_S$ is a reversible $q^{ary}$ code implies: (1) if the (n by n)-symbol matrix X is a codeword of C, then so is the transpose matrix $X^T$ because the row and column code are the same; and (2) if X is a codeword of C, then so is $X^F$ because the row and column code are the same and reversible (where the $X^F$ denotes a reflection of matrix X in the anti-diagonal, i.e., the matrix obtained by flipping all elements of X on the anti-diagonal).

For the product code C, the corresponding quarter product code (QPC) $C_Q$ is defined as the subcode given by $C_Q = \{X - X^T - (X - X^T)^F : X \in C\}$. By construction, every codeword Y of $C_Q$ has a zero diagonal and zero anti-diagonal. By symmetry, the entries in a triangular subarray confined between the two diagonals determine the QPC codeword as illustrated in FIG. 3. Thus, the effective codeword length of the QPC is $N_Q = (n^2 - 2n)/4 = n'^2 - n' = n'(n'-1)$.

Further information regarding the construction and use of HPCs and QPCs in encoding and decoding data can be found in T. Mittelholzer, T. Parnell, N. Papandreou, H. Pozidis, "Symmetry-Based Subproduct Codes," Proc. IEEE Int'l Symp. on Information Theory 2015, Hong Kong, PR of China, June 2015, and in Mittelholzer et al., "Forward correction by block code memory access check bits stored in separate area of memory," U.S. Patent Publication No. 2015/0309875, which are both incorporated herein by reference.

BRIEF SUMMARY

The error correcting performance of HPC and QPC codes, expressed, for example, as raw bit error rate (RBER) versus the uncorrectable bit error rate (UBER), has two regimes: a waterfall region having a steep decrease of RBER-performance and an error floor region in which the RBER decreases slowly. In many cases, HPCs and QPCs provide the desired steep error correcting profile in the waterfall region, but do not meet the stringent error correcting specifications of data storage devices (e.g., flash memory) or data communications systems (e.g., OTNs) in the error floor region.

The present application recognizes that it would be desirable to improve the error correcting performance achieved using binary HPCs and QPCs in the error floor region. One technique to reduce the error floor is to identify selected stopping sets (also referred to as "stalling sets") of an iterative decoder that can be corrected by post-processing. By correcting at least some of the stopping sets of the iterative decoder, post-processing improves the error correcting performance in the error floor region, and can thus enables use of binary HPCs and QPCs (which may have improved efficiency in terms of code rate) that would otherwise not meet stringent low-BER requirements without such post-processing.

In at least one embodiment, a decoder performs iterative decoding of a codeword encoded by a binary symmetry-invariant product code, such as a half product code or quarter product code. In response to the iterative decoding reaching a stopping set, the decoder determines by reference to an ambient error graph formed from the stopping set whether or not the stopping set is correctable by post-processing. If not, the decoder outputs the uncorrected codeword and signals a decoding failure. In response to determining that the stopping set is correctable by post-processing, the decoder inverts all bits of the codeword corresponding to edges of the ambient error graph, applies an additional round of iterative decoding to the codeword to obtain a corrected codeword, and outputs the corrected codeword. Post-processing in this manner substantially lowers an error floor associated with the binary symmetry-invariant product code.

BRIEF DESCRIPTION OF THE SEVERAL VIEWS OF THE DRAWINGS

FIG. 1 illustrates a conventional product code;

FIG. 2 illustrates a prior art half product code (HPC) codeword;

FIG. 3 illustrates a prior art quarter product code (QPC) codeword;

FIG. 12 is a high level logical flowchart of an exemplary process by which a decoder, for example, of a data storage system or a data communication system, decodes an codeword encoded utilizing a binary symmetry-invariant product code in accordance with one embodiment;

DETAILED DESCRIPTION

In at least one aspect, the present application is directed to a decoder for decoding codewords of data encoded utilizing binary symmetry-invariant product codes, such as half product codes (HPCs) and quarter product codes (QPCs). The decoder employs post-processing to correct at least some stopping steps not correctable by iterative decoding alone. The decoder may be implemented, for example, as a component of a data storage system or a data communication system. The application is further directed to related methods and program products.

Although the inventions described herein can be applied to conventional HPCs and QPCs as discussed above, it should be appreciated that the invention disclosed herein are also applicable to symmetry-invariant product codes formed with more than one type of component code per row and more than one type of component code per column. Similarly, further extensions of HPCs and QPCs can be obtained by using more than one type of component code in the code constructions. For example, one may use two types of component codes of the same length n but with different error correction capabilities $t_1$ and $t_2$. In the HPC case, one may require that the first half of the row/columns are codewords from the $t_1$-error correcting component code, and the second half of the row/columns are codewords from the $t_2$-error correcting component code.

Figure 4:
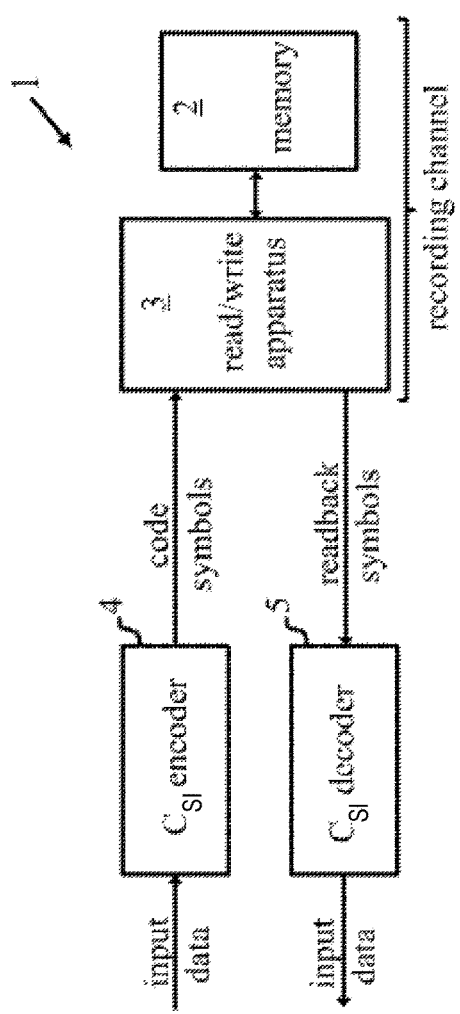
FIG. 4 is a high level block diagram of a data storage system in accordance with one embodiment.

With reference again to the figures and in particular with reference to FIG. 4, there is a schematic block diagram of an exemplary embodiment of a data storage system 1 for reading and writing ECC-encoded data on a data storage device. Data storage system 1 includes a recording channel including a memory 2 (e.g., a flash memory or other non-volatile random access memory (NVRAM)) and a read/write apparatus 3 for reading and writing data in memory 2. Although shown as a single block, memory 2 may comprise any desired configuration of data storage units ranging, for example, from a single chip or die to a plurality of storage banks each including multiple packages of memory chips. Read/write apparatus 3 performs read and write operations in known manner, addressing individual memory cells for read and write purposes by applying appropriate voltages to an array of word and bit lines in memory 2.

Data storage system 1 further includes a data encoder 4 and a data decoder 5. Encoder 4 encodes input data into code symbols in accordance with a binary symmetry-invariant product code $C_{SI}$ (e.g., an HPC or QPC) and outputs the code symbols to the recording channel. Decoder 5 processes the readback symbols obtained by read/write apparatus 3 from memory 2 to decode the symmetry-invariant product code $C_{SI}$ and so recover the original input data.

Figure 5:
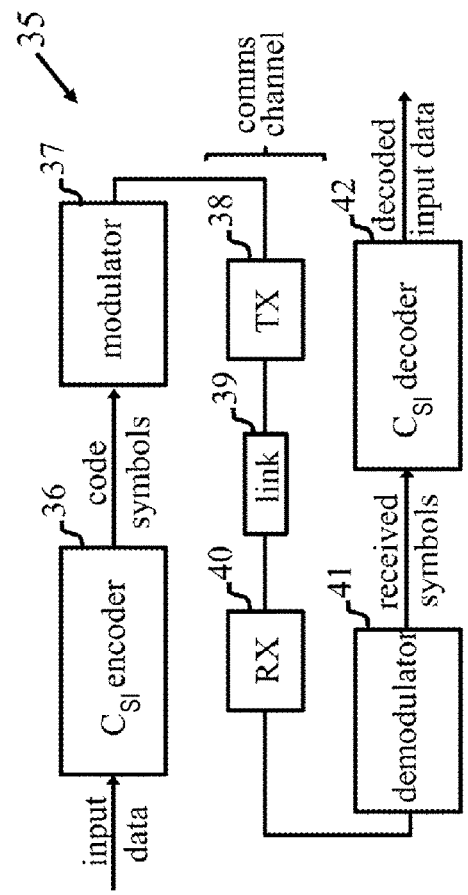
FIG. 5 is a high level block diagram of a data communication system in accordance with one embodiment.

As further illustrated in FIG. 5, symmetry-invariant product codes such as HPCs and QPCs also find application in data communication systems, such as data communication system 35. The transmitter of the system comprises a $C_{SI}$ encoder 36 as described above with reference to FIG. 4, a modulator 37, and a transmission device (TX) 38. Code symbols output by $C_{SI}$ encoder 36 are supplied, via modulator 37, to a transmission device 38, which generates a signal for transmitting the code symbols over a communications link 39. The communications link 39 may comprise a physical (wired or wireless) link or a logical link over one or more physical links. A receiver of the system includes a receiving device (RX) 40 for receiving the signal transmitted over link 39, a demodulator 41 for demodulating the received signal, and a $C_{SI}$ decoder 42 as described above for decoding the resulting code symbols received from demodulator 41.

In general, the functionality of encoders 4, 36 and decoders 5, 42 can be implemented in hardware alone or by hardware executing program instructions of software and/or firmware. For example, encoding and decoding can be performed in whole or in part through the execution of software that configures one or more processors as encoders and/or decoders to perform the encoding and decoding. To achieve greater performance, however, encoders 4, 36 and decoders 5, 42 are preferably implemented entirely in hardware logic circuits (e.g., integrated circuitry).

Figure 6A:
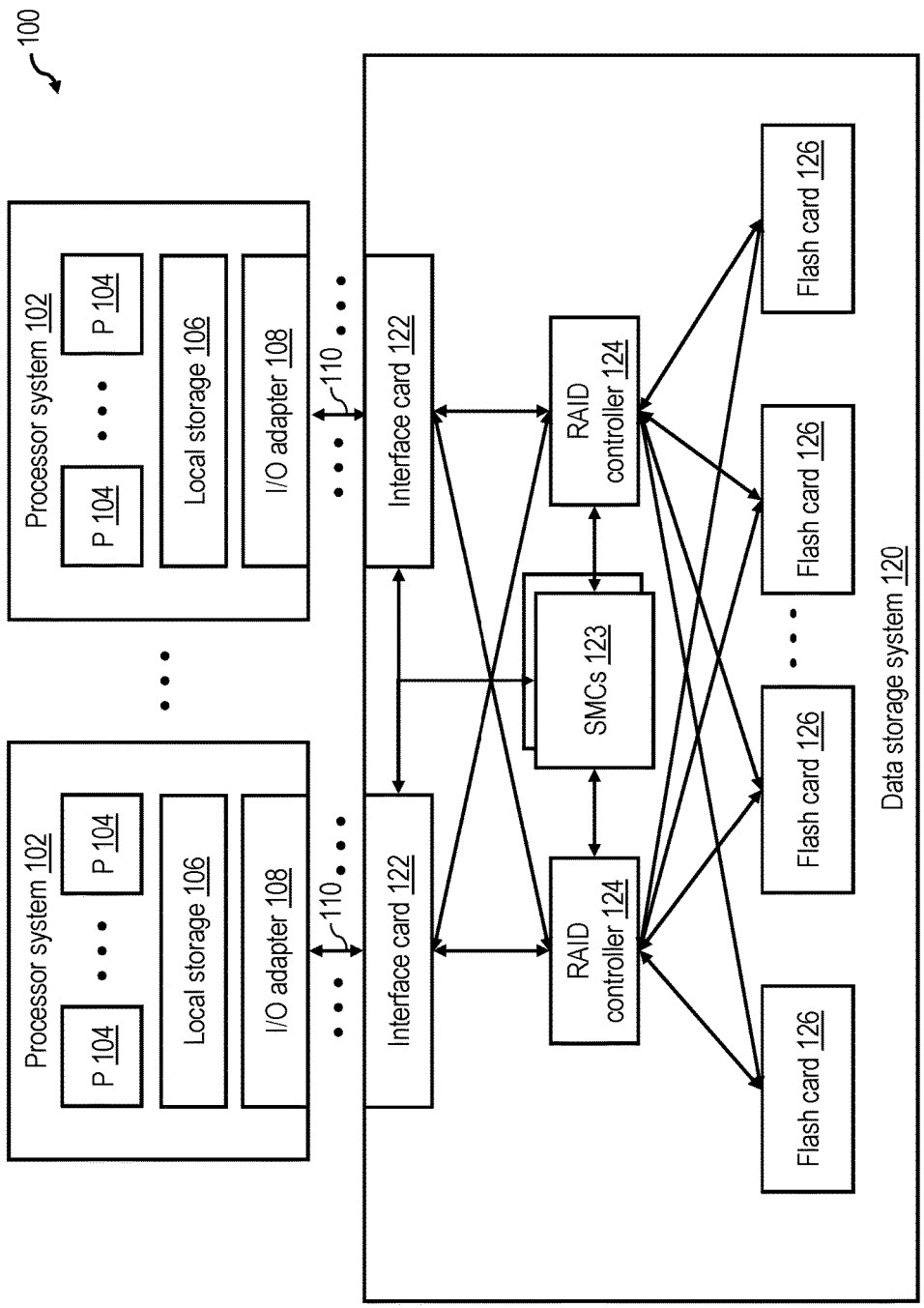
FIGS. 6A-6B illustrate an exemplary implementation of the data storage system of FIG. 4.
Figure 6B:
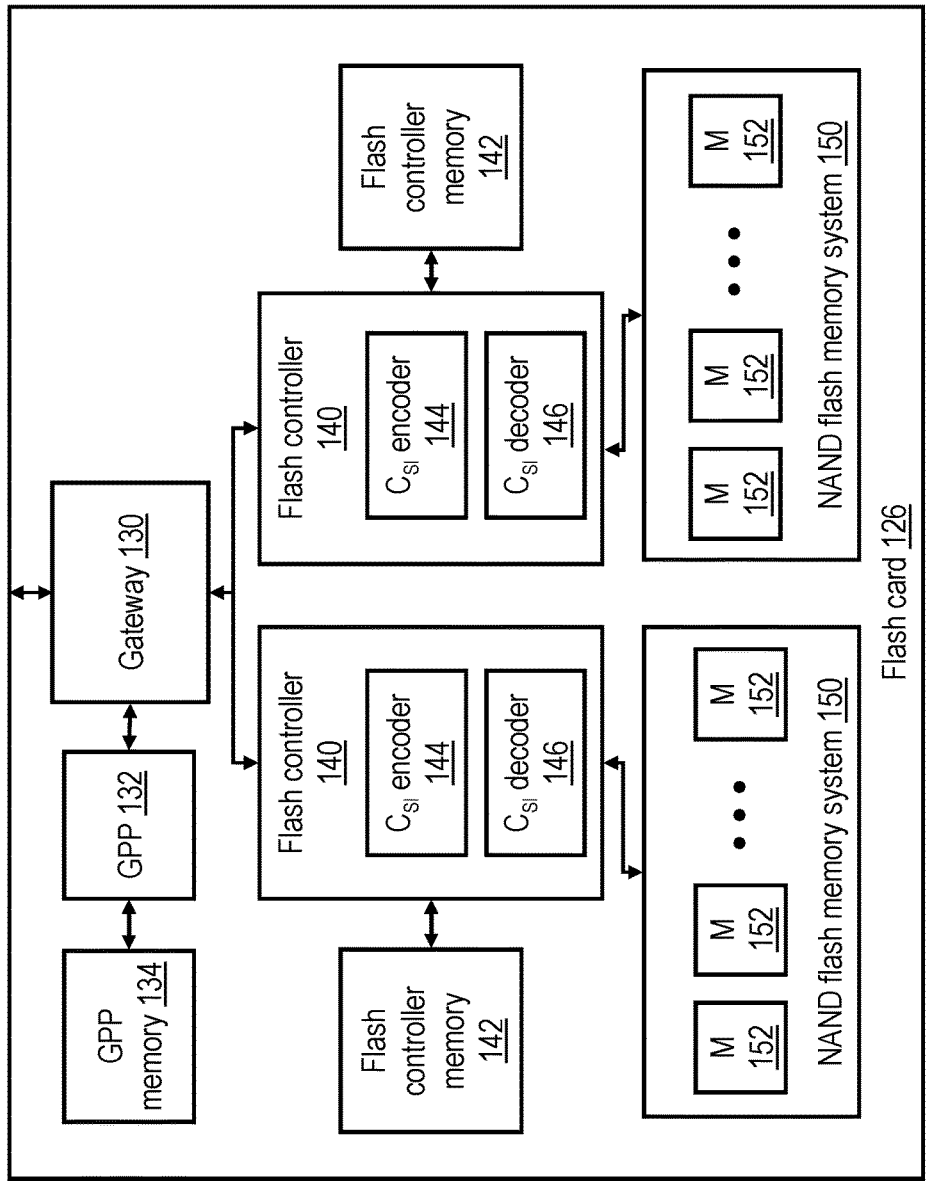

Referring now to FIGS. 6A-6B, there are depicted more detailed block diagrams of an exemplary implementation of data storage system 1 of FIG. 4. FIG. 6A illustrates a data processing environment 100 including one or more hosts, such as a processor system 102 having one or more processors 104 that process instructions and data. A processor system 102 may additionally include local storage 106 (e.g., dynamic random access memory (DRAM) or disks) that may store program code, operands and/or execution results of the processing performed by processor(s) 104. In various embodiments, a processor system 102 can be, for example, a mobile computing device (such as a smartphone or tablet), a laptop or desktop personal computer system, a server computer system (such as one of the POWER series of servers available from International Business Machines Corporation), or a mainframe computer system. A processor system 102 can also be an embedded processor system using various processors such as ARM, PowerPC, Intel X86, or any other processor combined with memory caches, memory controllers, local storage, I/O bus hubs, etc.

Each processor system 102 further includes an input/output (I/O) adapter 108 that is coupled directly (i.e., without any intervening device) or indirectly (i.e., through at least one intermediate device) to a data storage system 120 via an I/O channel 110. In various embodiments, I/O channel 110 may employ any one or a combination of known or future developed communication protocols, including, for example, Fibre Channel (FC), FC over Ethernet (FCoE), Internet Small Computer System Interface (iSCSI), InfiniBand, Transport Control Protocol/Internet Protocol (TCP/IP), Peripheral Component Interconnect Express (PCIe), etc. I/O operations (IOPs) communicated via I/O channel 110 include read IOPs by which a processor system 102 requests data from data storage system 120 and write IOPs by which a processor system 102 requests storage of data in data storage system 120.

Although not required, in the illustrated embodiment, data storage system 120 includes multiple interface cards 122 through which data storage system 120 receives and responds to input/output operations (IOP) of hosts via I/O channels 110. Each interface card 122 is coupled to each of multiple Redundant Array of Inexpensive Disks (RAID) controllers 124 in order to facilitate fault tolerance and load balancing. Each of RAID controllers 124 is in turn coupled (e.g., by a PCIe bus) to non-volatile storage media, which in the illustrated example include multiple flash cards 126 bearing NAND flash memory. In other embodiments, alternative and/or additional non-volatile storage devices can be employed.

In the depicted embodiment, the operation of data storage system 120 is managed by redundant system management controllers (SMCs) 123, which are coupled to interface cards 122 and RAID controllers 124. In various embodiments, system management controller 123 can be implemented utilizing hardware or hardware executing firmware and/or software.

FIG. 6B depicts a more detailed block diagram of an exemplary embodiment of a flash card 126 of data storage system 120 of FIG. 1A. Flash card 126 includes a gateway 130 that serves as an interface between flash card 126 and RAID controllers 124. Gateway 130 is coupled to a general-purpose processor (GPP) 132, which can be configured (e.g., by program code) to perform pre-processing on IOPs received by gateway 130 and/or to schedule servicing of the IOPs by flash card 126. GPP 132 is coupled to a GPP memory 134 (e.g., Dynamic Random Access Memory (DRAM)) that can conveniently buffer data created, referenced and/or modified by GPP 132 in the course of its processing or data flowing through the gateway 130 destined for one or more of the flash controllers 140.

Gateway 130 is further coupled to multiple flash controllers 140, each of which controls a respective NAND flash memory system 150. Flash controllers 140 can be implemented, for example, by an Application Specific Integrated Circuit (ASIC) and/or a Field Programmable Gate Array (FPGA) and/or a microprocessor, and each have an associated flash controller memory 142 (e.g., DRAM). In embodiments in which flash controllers 140 are implemented with an FPGA, GPP 132 may program and configure flash controllers 140 during start-up of data storage system 120. After startup, in general operation flash controllers 140 receive read and write IOPs from gateway 130 that request to read data stored in NAND flash memory system 150 and/or to store data in NAND flash memory system 150. Flash controllers 140 service these IOPs, for example, by accessing NAND flash memory system 150 to read or write the requested data from or into NAND flash memory system 150 or by accessing a memory cache (not illustrated) associated with NAND flash memory system 150.

Flash controllers 140 implement a flash translation layer (FTL) that provides logical-to-physical address translation to enable access to specific memory locations within NAND flash memory systems 150. In general, an IOP received by flash controller 140 from a host device, such as a processor system 102, contains the logical block address (LBA) at which the data is to be accessed (read or written) and, if a write IOP, the write data to be stored to data storage system 120. The IOP may also specify the amount (or size) of the data to be accessed. Other information may also be communicated depending on the protocol and features supported by data storage system 120. The flash translation layer translates LBAs received from a RAID controller 124 into physical addresses assigned to corresponding physical location in NAND flash memory systems 150. Flash controllers 140 may perform address translation and/or store mappings between logical and physical addresses in a logical-to-physical translation data structure, such as a logical-to-physical translation table (LPT), which may conveniently be stored in flash controller memory 142.

NAND flash memory systems 150 may take many forms in various embodiments. In the embodiment shown in FIG. 1B, each NAND flash memory system 150 includes multiple (e.g., 32) individually addressable NAND flash memory storage devices 152. In the illustrated example, the flash memory storage devices 152 take the form of a board-mounted flash memory modules, for example, Single Level Cell (SLC), Multi-Level Cell (MLC), Three Level Cell (TLC), or Quad Level Cell (QLC) NAND flash memory modules. The fidelity of data read from flash memory storage devices 152 is preferably enhanced through the implementation of ECC encoding, for example, by flash controllers 140 and/or high level controllers, such as GPPs 132 or RAID controllers 124. In the illustrated embodiment, ECC encoding and decoding is implemented at least in flash controllers 140 by a $C_{SI}$ encoder 144 and $C_{SI}$ decoder 146.

Figure 7:
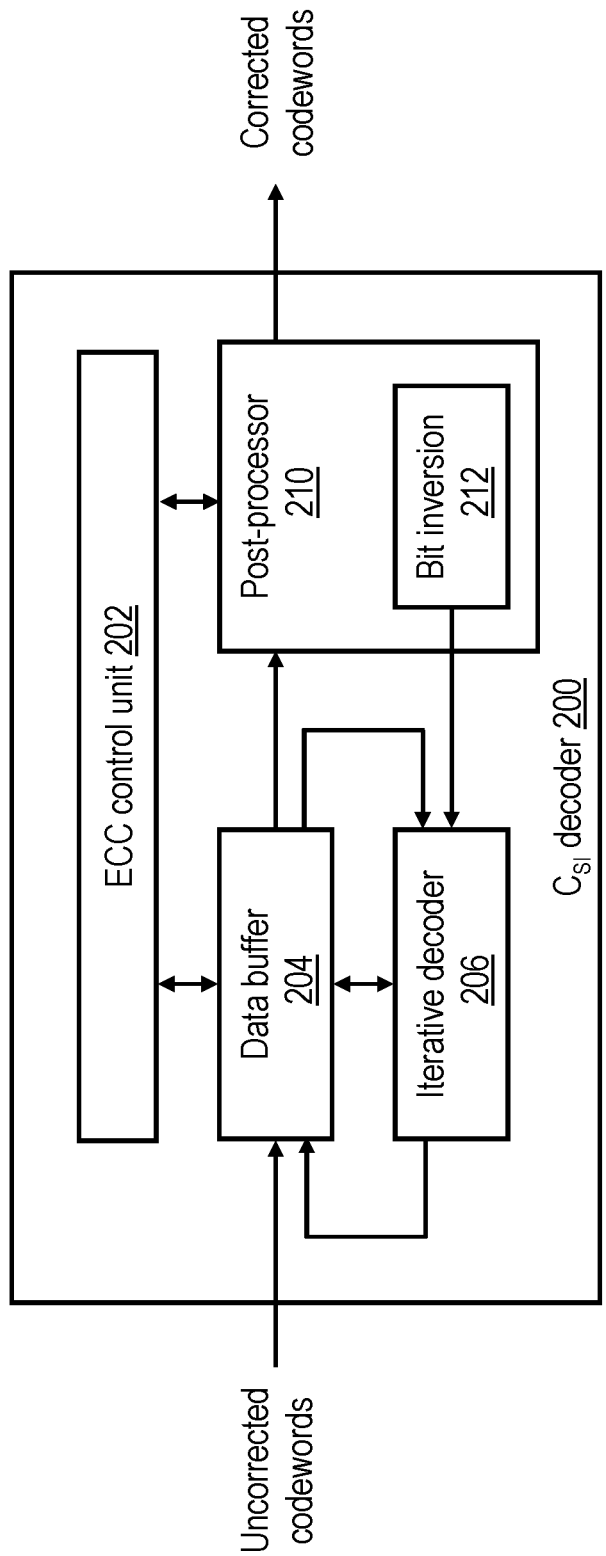
FIG. 7 illustrates an exemplary decoder in accordance with one embodiment.

With reference now to FIG. 7, there is illustrated an exemplary embodiment of a decoder 200 in accordance with one embodiment. Decoder 200, which can be utilized to implement any of decoders 5, 42 or 146, decodes data that has been encoded utilizing a binary symmetry-invariant product code (e.g., an HPC or QPC).

As shown in FIG. 7, decoder 200 includes an ECC control unit 202 that controls the decoding of uncorrected codewords encoded utilizing a binary symmetry-invariant product code (e.g., HPC or QPC). In addition, decoder 200 includes a data buffer 204 that buffers the incoming uncorrected codewords and a possibly conventional iterative decoder 206 that iteratively decodes the uncorrected codewords buffered by data buffer 204. In one example, decoder 206 may be configured to iteratively decode BCH (Bose Chaudhuri Hocquenghem) encoded data. Decoder 200 further includes a post-processor 210 including bit inversion logic 212. As described below, post-processor 210 selectively performs post-processing on stopping sets of iterative decoder 206 (i.e., those codewords that cannot be corrected by the conventional iterative decoding performed by iterative decoder 206). The post-processing includes the inversion by bit inversion logic 212 of selected bits within an uncorrected codeword. Once the bits of the uncorrected codeword are inverted by bit inversion logic 212, iterative decoder 206 is able to complete the correction of the codeword, which is then output by decoder 200.

Figures 8, 9:
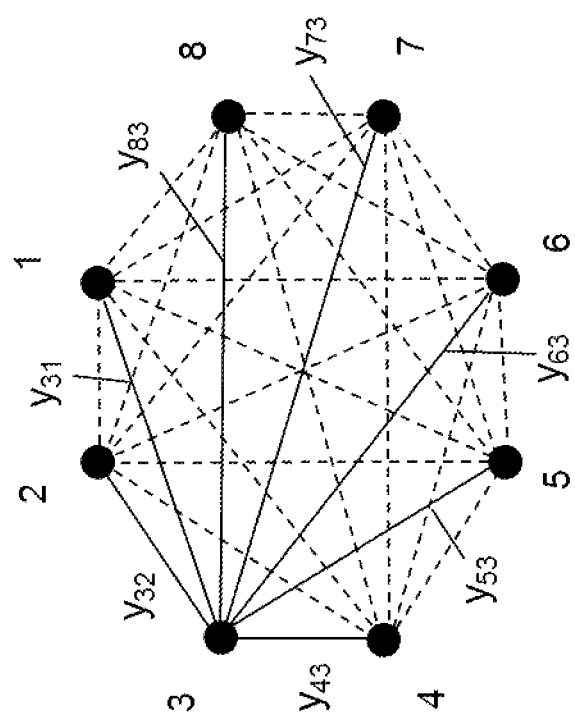
FIG. 8 depicts a graphical model (or code graph) of the exemplary HPC depicted in FIG. 2.
FIG. 9 illustrates an exemplary error constellation in the HPC codeword of FIG. 2 that forms a stopping set S.

Referring now to FIG. 8, there is illustrated a graphical model (or code graph) of the exemplary binary HPC depicted in FIG. 2. In a preferred embodiment, the code graph may be utilized by iterative decoder 206 to perform iterative decoding of codewords. The code graph of the HPC is the complete graph with n vertices, where n is the length of the component code. The vertices represent folded codewords of the component code, and the edges represent the codeword bits (codeword components). In this example, the binary HPC is characterized by an effective length, dimension and minimum distance of (N=28,K=6,D=12) based on an original (n=8,k=4,d=4) extended binary Hamming code, which is a t=1 error-correcting component code. To promote greater understanding, FIG. 8 further highlights the edges formed by the codeword bits (codeword components) of the third row/column of the HPC. For example, the edge connecting the third and first vertices represents codeword bit $y_{31}$, the edge connecting the third and second vertices represents codeword bit $y_{32}$, the edge connecting the third and fourth vertices represents codeword bit $y_{43}$, etc. The other edges shown in dashed line illustration are constructed similarly. Further details regarding the formation of code graphs can be found, for example, in J. Justesen, "Performance of Product Codes and Related Structures with Iterated Decoding," IEEE Trans. Communications, Vol. 59, No. 2, pp. 407-415, February 2011, which is incorporated herein by reference.

As noted above, the iterative decoding performed by iterative decoder 206 will on occasion reach a stopping set that cannot be corrected by further iterative decoding alone. Such stopping sets can be described by an error constellation on the code graph that forms a subgraph of the code graph with minimum edge degree greater than or equal to t+1, where t is the error correcting capability (i.e., the number of bits of error correction) supported by the underlying component code of the HPC. As an example, FIG. 9 again illustrates a matrix representing a (N=28,K=6,D=12) HPC based on a (n=8,k=4,d=4) extended binary Hamming code for which t=1. In this example, with errors in the received codeword at $y_{43}$, $y_{74}$, $y_{83}$, and $y_{87}$, the iterative decoding performed by iterative decoder 206 detects four nonzero syndromes of the four component codes corresponding to vertices 3, 4, 7, and 8; namely, each of these four component codewords has two errors (exceeding t=1) $\{y_{43}, y_{83}\}$, $\{y_{43}, y_{74}\}$, $\{y_{74}, y_{87}\}$, and $\{y_{83}, y_{87}\}$, respectively. These errors induce a stopping set S on the code graph.

Figure 10:
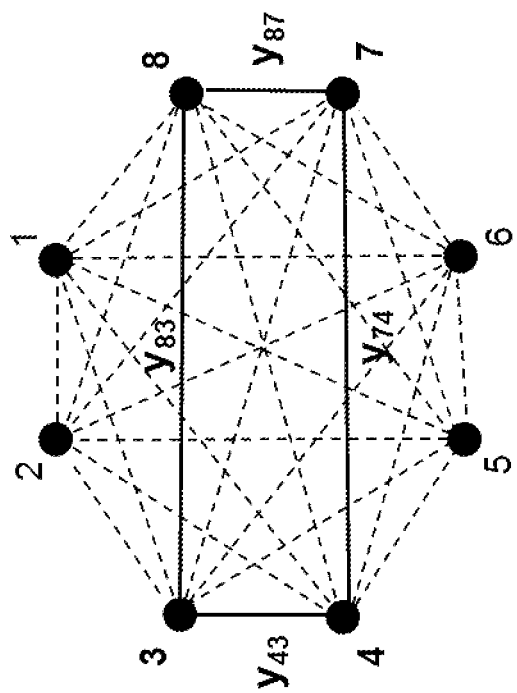
FIG. 10 depicts a subgraph of the ambient error graph $G_A$, which represents the exemplary stopping set S illustrated in FIG. 9.

FIG. 10 depicts a subgraph with four vertices and four edges, which represents the exemplary stopping set S, which is induced from the error constellation illustrated in FIG. 9. The ambient error graph $G_A$ is defined as a complete graph with vertices determined by those component codes with nonzero syndromes. The ambient error graph of the exemplary stopping set S has six edges $\{4,3\}$, $\{7,3\}$, $\{7,4\}$, $\{8,3\}$, $\{8,3\}$, and $\{8,7\}$ with labels $y_{43}$, $y_{73}$, $y_{74}$, $yg_3$, $yg_3$, and $y_{87}$, respectively, which are connected to the four vertices 3, 4, 7, and 8. The subgraph of stopping set S is formed by a first set of vertices corresponding to those component codes with nonzero syndromes that are not correctable through further iterative decoding alone. Thus, in the example of FIGS. 9-10, the subgraph representing the stopping set S includes the vertices 3, 4, 7, and 8 and a first set of edges corresponding to the erroneous codeword bits $y_{43}$, $y_{74}$, $y_{83}$, and $y_{87}$.

ECC control unit 202 is preferably configured to determine the correctability of possible stopping sets in the ambient error graph $G_A$, where such correctability can be determined a priori based on the error-correcting capability t of the component codes. In particular, ECC control unit 202 is preferably configured to determine that a stopping set S is correctable via post-processing by post-processor 210 if the complement graph of stopping set S, referred to herein as complement stopping set S̲, contains less than t or fewer edges for at least one vertex of the complement stopping set S̲. Expressed in a different but equivalent manner, ECC control unit 202 can be configured to determine that a stopping set S of a binary HPC is correctable via post-processing by post-processor 210 if v, which is number of non-zero syndromes (i.e., the number of vertices in the stopping set S), is less than or equal to 2t+2 for odd t and less than or equal to 2t+3 for even t. For QPC-encoded data, the ECC control unit 202 can be configured to determine that a stopping set S is correctable via post-processing by post-processor 210 if v, which is number of non-zero syndromes (i.e., the number of vertices in the stopping set), is less than or equal to t+1.

Figure 11:
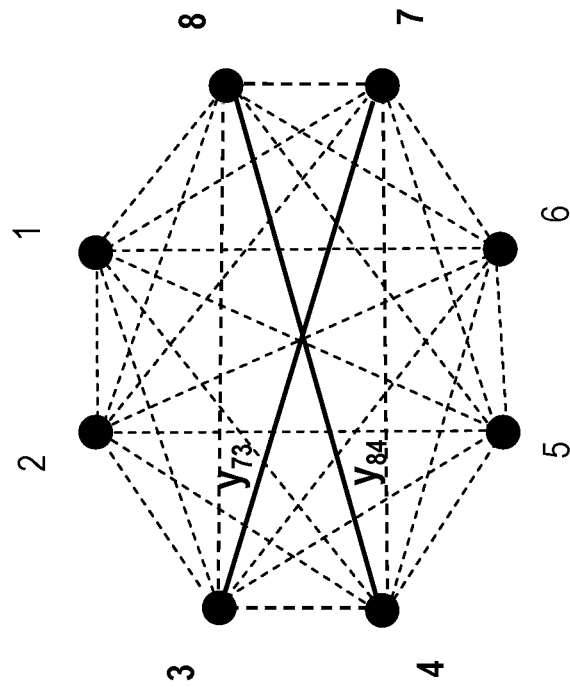
FIG. 11 illustrates a subgraph of the ambient error graph $G_A$, which represents the complement stopping set $\underline{S}$.

Continuing the example of FIGS. 9-10, FIG. 11 illustrates the complement stopping set S̲ derived from the stopping set S given in FIG. 10. It should be noted that complement stopping set S̲ includes a second set of edges, namely, those corresponding to $y_{84}$ and $y_{73}$. Because all four component codewords corresponding to vertices 3, 4, 7, and 8, contain t or fewer edges (recall t=1 for the exemplary extended Hamming code), this simplified complement stopping set S̲ with this second set of edges is correctable by the iterative decoding performed by iterative decoder 206. Consequently, if the stopping set S corresponds to a correctable constellation, decoder 200 inverts all bits corresponding to the edges of the ambient error graph $G_A$ to obtain complement stopping set S̲ and applies at least one additional round of iterative decoding.

Referring now to FIG. 12, there is depicted a high level logical flowchart of an exemplary process by which a decoder, for example, of a data storage system or a data communication system, decodes an codeword encoded utilizing a symmetry-invariant product code (e.g., a HPC or QPC) in accordance with one embodiment. The illustrated process can be implemented, for example, by decoder 200 of FIG. 7 under the control of ECC control unit 202 and is therefore described below in this context.

The process of FIG. 12 begins at block 300 and then proceeds to block 302, which illustrates decoder 200 receiving a codeword and buffering the received codeword within data buffer 204. At block 304, iterative decoder 206 performs possibly conventional iterative decoding of the codeword buffered in data buffer 204. ECC control unit 202 determines at block 306 whether or not the iterative decoding performed at block 304 detected errors in the codeword that induced a stopping set S. If not, the process passes from block 306 to block 314, which illustrates decoder 200 outputting the corrected codeword. In this case, post-processor 210 need not perform any further processing on the codeword. Thereafter, processing of the codeword by decoder 200 ends at block 316. It should be appreciated, however, that the corrected codeword may then be thereafter be transmitted, processed and/or stored by a receiving system communicatively coupled to decoder 200.

Returning to block 306 of FIG. 12, in response to a determination that the iterative decoding performed by iterative decoder 206 detected errors in the codeword that induced a stopping set S, ECC control unit 202 further determines at block 308 whether or not the stopping set S corresponds to an error constellation that is correctable by post-processing. As noted above, ECC control unit 202 may make the determination illustrated at block 308 by reference to whether the complement stopping set S̲ derived from stopping set S has a vertex with fewer edges than the number t of errors correctable by the component codes of the codeword. Equivalently, ECC control unit 202 may make the determination illustrated at block 308 based on the number of vertices in stopping set S, as discussed above. In response to a determination at block 308 that the stopping set S is correctable by post-processing, the process proceeds from block 308 to block 312 and following blocks, which are described below. In response to a determination at block 308 that the stopping set S is not correctable by post-processing, the process instead passes from block 308 to block 310, which illustrates post-processor 210 outputting the uncorrected codeword without performing any additional processing and signaling a decode failure for the codeword. Following block 310, the process of FIG. 12 ends at block 316. The decode failure may, for example, cause a recording channel of a data storage system to re-read the codeword from the storage device or cause a transmitter of a data communication system to re-transmit the codeword.

Referring now to block 312, in response to ECC control unit 202 determining that the stopping set S is correctable by post-processing, post-processor 210 uses bit inversion logic 212 to invert all bits corresponding to the edges of the ambient error graph $G_A$ to obtain the complement stopping set S̲. Post-processor 210 then causes iterative encoder 206 to apply at least one additional round of iterative decoding to the codeword, as indicated in FIG. 12 by the process returning to block 304. In a preferred embodiment, post-processor 210 applies a single additional round of iterative decoding for odd t and may selectively apply one or two additional rounds of iterative decoding for even t. As discussed above, because the number of errors is now correctable by iterative decoder 206, when the process returns to block 306, no errors are found in the codeword. Post-processor 210 accordingly outputs the corrected codeword at block 314. Thereafter, the process of FIG. 12 ends at block 316.

Figure 13:
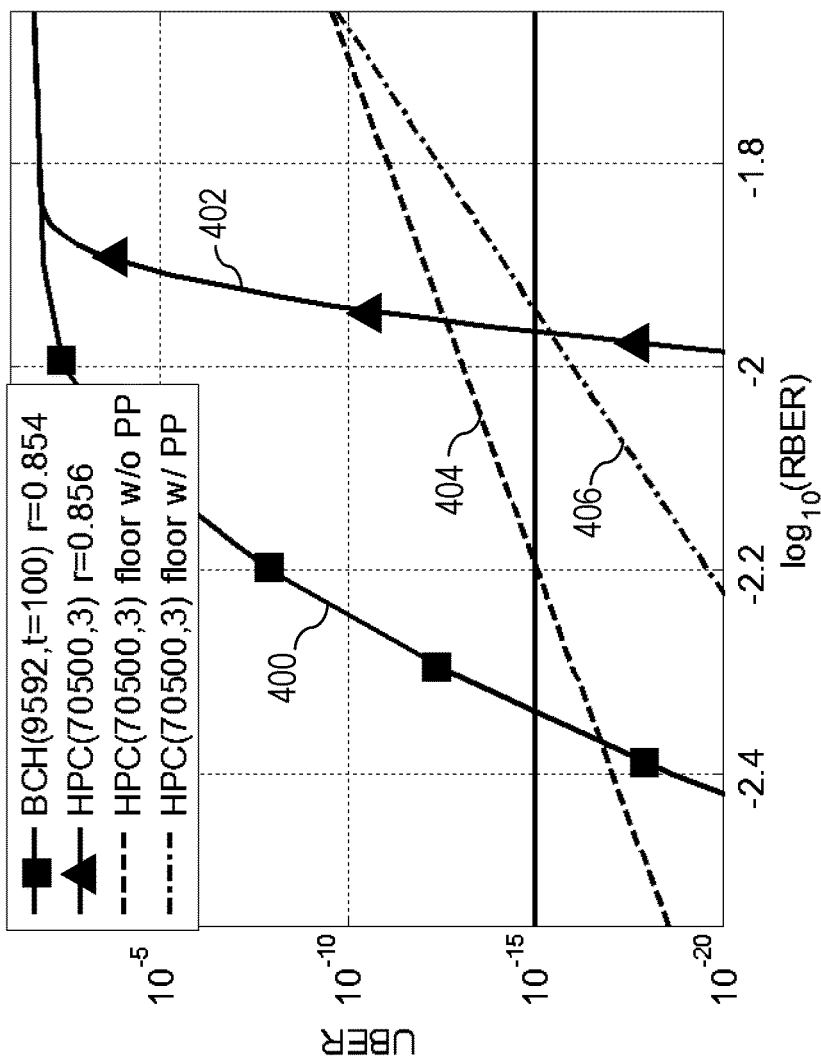
FIG. 13 is a graph illustrating an example of the error correcting performance improvement achieved by applying the process of FIG. 12 to the decoding of codewords encoded utilizing an HPC.

FIG. 13 is a graph illustrating an example of the performance improvement achieved by applying the process of FIG. 12 to the decoding of codewords encoded utilizing an exemplary HPC of length 70,500 based on 3-error correcting (376, 348, d=8) BCH code. In FIG. 13, the base-ten logarithm of the RBER is plotted along the X axis and the UBER is plotted along the Y axis.

In FIG. 13, curve 400 represents the error correction performance of an exemplary BCH code of length 9,592 and an error correcting capability of t=100. As shown, the BCH code results in a threshold UBER of $10^{-15}$ at a $\log_{10}$ (RBER) of approximately −2.34. Curve 402 further represents the error correction performance of an exemplary HPC of similar code rate, which has a length 70,500 based on a 3-error correcting (376, 348, d=8) BCH code. As seen by comparison of curves 400 and 402, use of the HPC provides significantly better error correcting performance in the steeply sloped waterfall region of curve 402. However, the conventional error floor of the iterative decoder represented by curve 404 does not allow HPC-based encoding to achieve the UBER threshold of $10^{-15}$ until $\log_{10}$ (RBER) reaches approximately −2.2. However, by implementing post-processing in the decoder in accordance with the method FIG. 12, the error floor is advantageously lowered from curve 404 to curve 406, meaning that post-processing as described above enables the UBER threshold of $10^{-15}$ to be reached at $\log_{10}$ (RBER) of approximately −1.97.

Figure 14A:
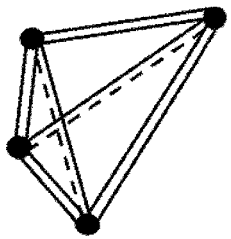
FIGS. 14A-14B are subgraphs of the ambient error graph $G_A$ illustrating an exemplary stopping set S and complement stopping set $\underline{S}$ for a codeword encoded utilizing a QPC.
Figure 14B:
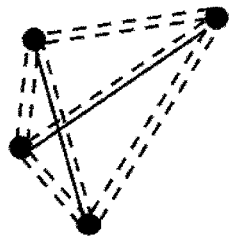

As noted above, the decoding process of FIG. 12 is applicable not only to codewords encoded by a HPC, but also codewords encoded with other binary symmetry-invariant product codes, such as QPCs. By construction of a QPC, the code graph of an QPC that is based on an (n'=2n,k',t) reversible binary component code is a complete graph with n vertices and double edges (for BCH component codes t=2t' is always even). Consequently, as shown in FIG. 14A, an exemplary subgraph of the ambient error graph $G_A$ can be utilized to represent a stopping set S having v vertices, which are all connected by double edges. Post-processor 210 can form the complement stopping set S̲ as discussed above by inverting all edge bits of the ambient error graph $G_A$, as shown in FIG. 14B. As noted above, ECC control unit 202 can determine that a stopping set S is correctable by post-processing if the number of edges in the complement stopping set S is less than or equal to t, the number of errors correctable by the component code of the QPC. Stated equivalently, ECC control unit 202 can determine that a stopping set S is correctable by post-processing if v, the number of vertices in stopping set S, is less than or equal to t+1.

Figure 15:
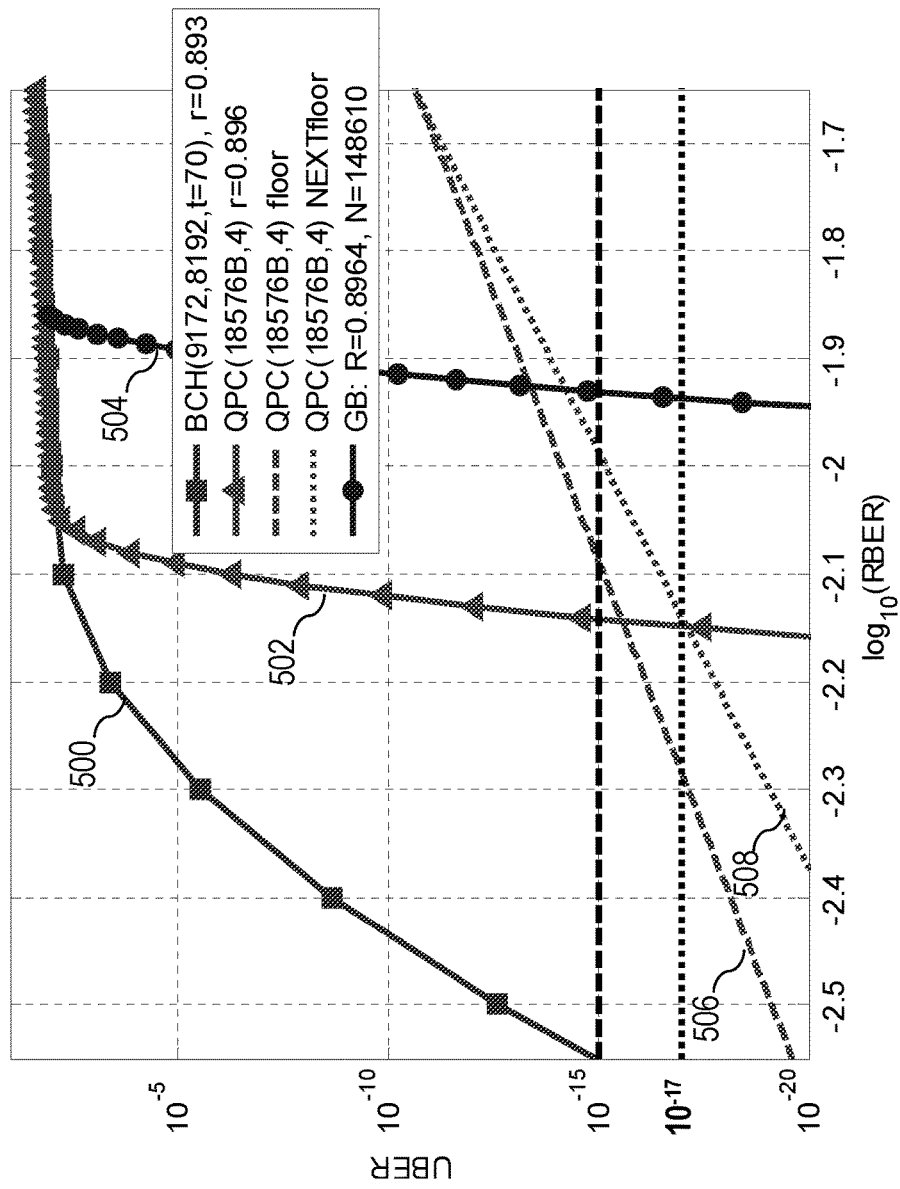
FIG. 15 is a graph illustrating an example of the error correcting performance improvement achieved by applying the process of FIG. 12 to the decoding of codewords encoded utilizing a QPC.

FIG. 15 is a graph illustrating an example of the performance improvement achieved by applying the process of FIG. 12 to the decoding of codewords encoded utilizing an exemplary QPC of length 18,576 based on 4-error correcting (772, 731, t=4) reversible binary BCH code. In FIG. 15, the base-ten logarithm of the RBER is again plotted along the X axis, and the UBER is plotted along the Y axis.

In FIG. 15, curve 500 represents the error correction performance of an exemplary (9172, 8192, t=70) binary BCH code. As shown, the BCH code achieves a first threshold UBER of $10^{-15}$ at a $\log_{10}$ (RBER) of approximately −2.54. As indicated by the steeper slope of curve 502 in its waterfall region, the error correction performance of the exemplary QPC is significantly better and more closely approximates the Gallager random coding bound (GB) represented by curve 504. However, the conventional error floor of the iterative decoder represented by curve 506 does not allow the QPC to achieve a second UBER threshold of $10^{-17}$ until $\log_{10}$ (RBER) reaches approximately −2.3. However, by implementing post-processing in the decoder in accordance with the method FIG. 12, the error floor is advantageously substantially lowered from curve 506 to curve 508, meaning that post-processing as described enables the second UBER threshold of $10^{-17}$ to be reached at $\log_{10}$ (RBER) of approximately −2.15.

As has been described, in at least one embodiment, the iterative decoder of an HPC or QPC fails to decode further and halts on an unknown stopping set (or error graph) S. By considering the ambient error graph $G_A$ of S, whose vertices correspond to the known nonzero syndromes of the component codes, ECC control logic determines if the stopping set S is correctable within at least one additional round of iterative decoding. The stopping set S is correctable if the complement graphs of all potential stopping sets S' in $G_A$ have minimal edge degree of at most t. If the stopping set S is correctable, the post-processor inverts (reverses) all bits corresponding to the edges of the ambient error graph $G_A$ and applies at least one (and in some preferred embodiments, a single) additional round of iterative decoding. Otherwise, the post-processor leaves the output of the iterative decoder unchanged and declares a failure. For different classes of binary symmetry-invariant product codes (e.g., HPC or QPC) and different values of error correction parameter t, there are different types of ambient error graphs $G_A$. The maximum number L of required additional decoding iterations is a design parameter of the post-processor; it depends on the class of binary symmetry-invariant product code employed (e.g., HPC or QPC) and on the error correction capability t of the component code. For all scenarios, the post-processor can be designed to require only L=1 additional iterative decoding round. For HPCs and odd t, the optimum post-processing requires only L=1, whereas for HPCs with even t, the optimum post-processing needs L>1 (e.g., 2) additional rounds of iterative decoding.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present invention has been particularly shown as described with reference to one or more preferred embodiments, it will be understood by those skilled in the art that various changes in form and detail may be made therein without departing from the spirit and scope of the invention. For example, although aspects have been described with respect to a data storage system including a flash controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude signal media per se, transitory propagating signals per se, and forms of energy per se.

In addition, although embodiments have been described that include use of a NAND flash memory, it should be appreciated that embodiments of the present invention can also be used with any other type of non-volatile random access memory (NVRAM).

The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. A method of decoding a codeword encoded by a binary symmetry-invariant product code, the method comprising:
   a decoder performing iterative decoding of the codeword;
   in response to the iterative decoding reaching a stopping set, the decoder determining by reference to an ambient error graph formed from the stopping set whether or not the stopping set is correctable by post-processing;
   in response to determining that the stopping set is not correctable by post-processing, the decoder outputting the codeword without correction and signaling a decoding failure; and
   in response to determining that the stopping set is correctable by post-processing, the decoder:
      inverting all bits of the codeword corresponding to edges of the ambient error graph;
      applying an additional round of iterative decoding to the codeword to obtain a corrected codeword; and
      outputting the corrected codeword.

2. The method of claim 1, wherein:
   the determining includes the decoder forming an complement error subgraph including multiple vertices and determining whether a number of edges of the complement error subgraph connected to a vertex of the complement error subgraph is no greater than an error correcting capability of component codes of the codeword.

3. The method of claim 1, wherein the codeword is a half product code (HPC)-encoded codeword.

4. The method of claim 3, wherein:
   the codeword is formed from component codes with an error correcting capability of t; and the determining includes the decoder determining the stopping set is correctable if a number of vertices in the error subgraph is no greater than 2t+1 for odd t and no greater than 2t+3 for even t.

5. The method of claim 1, wherein the codeword is a quarter product code (QPC)-encoded codeword.

6. The method of claim 5, wherein:
the codeword is formed from component codes with an error correcting capability of t; and
the determining includes the decoder determining the stopping set is correctable if a number of vertices in the error subgraph is no greater than t+1.

7. The method of claim 1, wherein applying an additional round of iterative decoding comprises applying a single additional round of iterative decoding to the codeword.

8. A program product, the program product comprising a computer readable storage medium having program instructions embodied therewith, the program instructions executable by a decoder to cause the decoder to perform:
performing iterative decoding of a codeword encoded with a symmetry-invariant product code;
in response to the iterative decoding reaching a stopping set, determining by reference to an ambient error graph formed from the stopping set whether or not the stopping set is correctable by post-processing;
in response to determining that the stopping set is not correctable by post-processing, outputting the codeword without correction and signaling a decoding failure; and
in response to determining that the stopping set is correctable by post-processing:
inverting all bits of the codeword corresponding to edges of the ambient error graph;
applying an additional round of iterative decoding to the codeword to obtain a corrected codeword; and
outputting the corrected codeword.

9. The program product of claim 8, wherein:
the determining includes forming a complement error subgraph including multiple vertices and determining whether a number of edges connected to a vertex of the complement error subgraph is no greater than an error correcting capability of component codes of the codeword.

10. The program product of claim 8, wherein the codeword is a half product code (HPC)-encoded codeword.

11. The program product of claim 10, wherein:
the codeword is formed from component codes having an error correcting capability of t; and
the determining includes determining the stopping set is correctable if a number of vertices in the error subgraph is no greater than 2t+1 for odd t and no greater than 2t+3 for even t.

12. The program product of claim 8, wherein the codeword is a quarter product code (QPC)-encoded codeword.

13. The program product of claim 12, wherein:
the codeword is formed from component codes having an error correcting capability of t; and
the determining includes determining the stopping set is correctable if a number of vertices in the error subgraph is no greater than t+1.

14. The program product of claim 8, wherein applying an additional round of iterative decoding comprises applying a single additional round of iterative decoding to the codeword.

15. A decoder for decoding a codeword encoded by a binary symmetry-invariant product code, comprising circuitry including:
an iterative decoder configured to perform iterative decoding of the codeword;
error correcting code control logic configured to perform, responsive to the iterative decoder reaching a stopping set:
determining by reference to an ambient error graph formed from the stopping set whether or not the stopping set is correctable by post-processing; and
responsive to determining that the stopping set is not correctable by post-processing, causing the decoder to output the codeword without correction and to signal a decoding failure; and
a post-processor configured to perform, responsive to a determination that the stopping set is correctable by post-processing:
inverting all bits of the codeword corresponding to edges of the ambient error graph;
invoking application of an additional round of iterative decoding to the codeword to obtain a corrected codeword; and
outputting the corrected codeword.

16. The decoder of claim 15, wherein:
the determining includes forming a complement error subgraph including multiple vertices and determining whether a number of edges connected to a vertex of the complement error subgraph is no greater than an error correcting capability of component codes of the codeword.

17. The decoder of claim 16, wherein the codeword in a quarter product code (QPC)-encoded codeword.

18. The decoder of claim 17, wherein:
the codeword is formed from component codes having an error correcting capability of t; and
the determining includes the decoder determining the stopping set is correctable if a number of vertices in the error subgraph is no greater than t+1.

19. The decoder of claim 15, wherein the codeword in a half product code (HPC)-encoded codeword.

20. The decoder of claim 19, wherein:
the codeword is formed from component codes having an error correcting capability of t; and
the determining includes the decoder determining the stopping set is correctable if a number of vertices in the error subgraph is no greater than 2t+1 for odd t and no greater than 2t+3 for even t.

* * * * *